United States Patent [19]

Temple

[11] Patent Number: 5,082,795
[45] Date of Patent: Jan. 21, 1992

[54] METHOD OF FABRICATING A FIELD EFFECT SEMICONDUCTOR DEVICE HAVING A SELF-ALIGNED STRUCTURE

[75] Inventor: Victor A. K. Temple, Clifton Park, N.Y.

[73] Assignee: General Electric Company, Schenectady, N.Y.

[21] Appl. No.: 267,757

[22] Filed: Nov. 1, 1988

Related U.S. Application Data

[63] Continuation of Ser. No. 938,666, Dec. 5, 1986, abandoned.

[51] Int. Cl.⁵ .................. H01L 21/266; H01L 21/467
[52] U.S. Cl. .......................................... 437/41; 437/6; 437/203; 357/23.4
[58] Field of Search .................. 437/6, 40, 41, 203; 357/23.4, 38, 39

[56] References Cited

U.S. PATENT DOCUMENTS

| | | | |
|---|---|---|---|
| 3,413,527 | 11/1968 | Davies | 357/53 |
| 3,855,608 | 12/1974 | George et al. | 357/22 |
| 3,953,879 | 4/1976 | O'Connor-D'Arlach et al. | 357/22 |
| 4,252,579 | 2/1981 | Ho et al. | 437/67 |
| 4,272,302 | 6/1981 | Jhabvala | 156/648 |
| 4,295,924 | 10/1981 | Garnache et al. | 156/643 |
| 4,502,072 | 2/1985 | Herberg | 357/38 |
| 4,502,914 | 3/1985 | Trumpp et al. | 156/643 |
| 4,516,315 | 5/1985 | Przybysz et al. | 437/203 |
| 4,589,193 | 5/1986 | Goth et al. | 437/62 |
| 4,612,465 | 9/1986 | Schutten et al. | 357/23.4 |
| 4,630,237 | 12/1986 | Miura et al. | 357/41 X |
| 4,639,288 | 1/1987 | Price et al. | 156/643 |
| 4,679,300 | 7/1987 | Chan et al. | 156/643 X |
| 4,683,643 | 8/1987 | Nakajima et al. | 437/203 |
| 4,689,871 | 9/1987 | Malhi | 437/40 |
| 4,693,781 | 9/1987 | Leung et al. | 156/643 |
| 4,754,310 | 6/1988 | Coe | 357/13 |
| 4,767,722 | 8/1988 | Blanchard | 437/41 |
| 4,772,926 | 9/1988 | Nishizawa et al. | 357/22 |

FOREIGN PATENT DOCUMENTS 0159663 10/1985 European Pat. Off. ........... 357/23.4

OTHER PUBLICATIONS

Cardon et al., *Dynamic Semiconductor RAM Structures*, Pergamon Press (Oxford, England 1984), pp. 310–311.
Hu, Chenming, "A Parametric Study of Power MOSFETS", 10th Power Electronics Specialists Conference, Record held Jan. 18–22, 1979, pp. 385–395.

*Primary Examiner*—Olik Chaudhuri
*Assistant Examiner*—Ourmazd Ojan
*Attorney, Agent, or Firm*—Robert Ochis; James C. Davis, Jr.; Marvin Snyder

[57] ABSTRACT

A self aligned method of fabricating a vertical channel insulated gate semiconductor device comprises providing a first layer of one type conductivity atop a partially processed wafer. A first protective layer is disposed over the first layer and a window is opened therethrough. A first region can be established through the first window and in the first layer. A trench is established through the first window, and extending entirely through the first region and first layer, into the partially processed wafer. An insulated gate is established in the trench to control the drift region electric field under reverse bias operation.

9 Claims, 10 Drawing Sheets

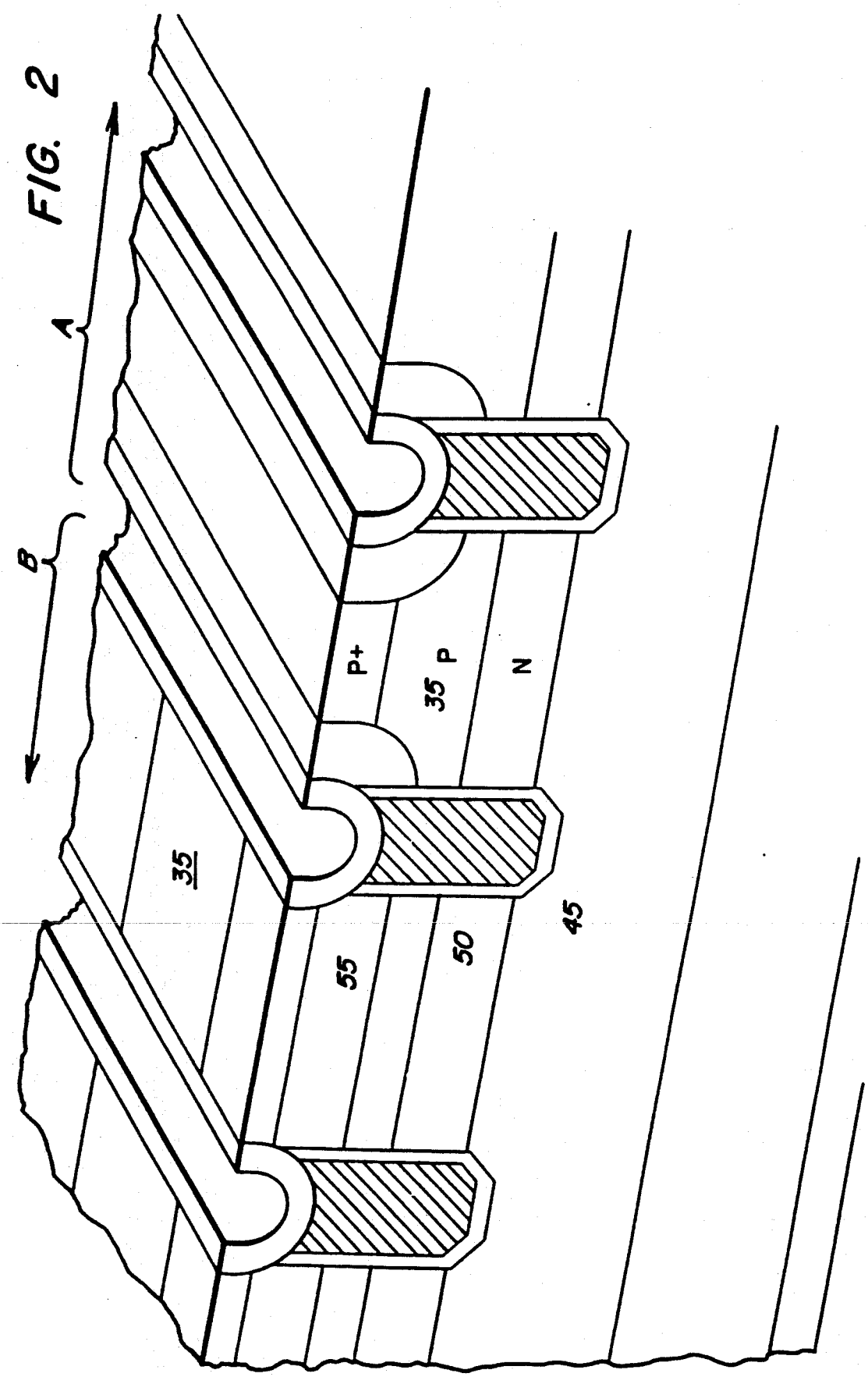

METHOD OF FABRICATING A FIELD EFFECT SEMICONDUCTOR DEVICE HAVING A SELF-ALIGNED STRUCTURE

This is a continuation of application Ser. No. 938,666 filed Dec. 5, 1986, now abandoned.

CROSS REFERENCE TO RELATED APPLICATIONS

This application is related to copending U.S. Pat. application Ser. No. 938,692, now abandoned, filed concurrently herewith for "Improved Semiconductor Devices Exhibiting Minimum On-Resistance" to V.A.K. Temple and assigned to the assignee of the present invention and the totality of which is incorporated by reference herein.

The present invention relates to a self aligned method of fabricating a semiconductor device and more particularly to a method of fabricating an insulated gate semiconductor device. A method of fabricating the improved semiconductor device of the present invention can be used to establish semiconductor devices such as metal oxide semiconductor field effect transistors (MOSFETs), insulated gate transistors (IGTs) and metal oxide semiconductor thyristors (MCTs) junction field effect transistors (JFETs) as well as junction and Schottky diodes.

BACKGROUND OF THE INVENTION

Conventional semiconductor devices have been fabricated through the repeated application of photolithographic techniques in combination with external masks to establish various regions within a device. It is difficult to precisely align one external mask with another external mask and consequently, various device regions may become misaligned. To overcome these misalignment problems, semiconductor devices have been designed with regions which are larger than necessary to provide tolerance zones to accommodate mask misalignments so that even when successive masks are misaligned, a working device can still be fabricated. Misalignment tolerant fabrication techniques are wasteful of semiconductor device real estate and provide devices having an excessive range of performance characteristics. While self aligned techniques have been previously employed to establish various semiconductor devices, these techniques have not been employed to establish vertical channel semiconductor devices.

OBJECTS OF THE INVENTION

A principle object of the present invention is to provide a self-aligned method of fabricating a vertical channel semiconductor device exhibiting a minimum onresistance.

Another object of the present invention is to provide a method of fabricating a self-aligned vertical channel semiconductor device in which the various device regions are precisely aligned to make maximum use of the available device real estate.

A still further object of the present invention is to provide semiconductor devices which exhibit substantially uniform operating characteristics

SUMMARY OF THE INVENTION

These and other objects and features of the present invention are achieved in a method of fabricating a self-aligned vertical channel semiconductor device including the following steps. Initially, a partially processed semiconductor wafer is provided. A first layer of one type conductivity semiconductor material is disposed atop the partially processed semiconductor material. The first layer can, for instance, be established by epitaxial growth on top of the partially processed semiconductor wafer or alternatively, by diffusion of one type conductivity dopants into the partially processed wafer. The first layer can include a heavily doped surface portion and a less heavily doped body portion. Thereafter, a first protective layer is established atop the first layer and covered with a temporary protective layer. The first protective layer can be established by, for instance, growing an oxide atop the first layer and then subsequently establishing a nitride layer atop the oxide layer. A temporary protective layer such as a CVD oxide layer can be provided atop the nitride layer. Conventional photolithographic techniques can be employed in combination with an external mask of desired configuration to open a first window through the temporary protective layer and the first protective layer to expose a first portion surface of the first layer.

Thereafter, in one embodiment, the first surface portion of the first layer can be doped with an opposite type conductivity dopant to establish an opposite type conductivity first region within the first layer and which extends beneath the first protective layer. In a preferred embodiment, opposite type conductivity dopants such as phosphorous impurities can be introduced with conventional diffusion or implantation techniques to establish the first region.

By using the previously established first window, a trench is established through the first region, if it is present, through the first layer and into a portion of the partially processed semiconductor wafer. The depth to which the trench extends into the wafer may vary. In a particularly preferred minimum on-resistance embodiment, the trench extends substantially into the wafer. The trench can be established by employing a directional etch, such as wet etch in the <110> direction in a silicon semiconductor material or a reactive ion etch or other directional dry etch. After the trench has been formed, the temporary protective layer can be removed because the purpose of the temporary protective layer is to protect the first protective layer from being etched away during the trench etch procedure. If the trench etchant does not attack the first protective layer, the temporary protective layer can be dispensed with.

Thereafter, an insulating layer is formed on the exposed surfaces of the trench in a silicon substrate embodiment by, for instance, exposing the trench surfaces at an elevated temperature to an oxygen atmosphere. The trench is then refilled with a gate electrode material which preferably can be replanarized and oxidized. Gate materials meeting these criteria include polysilicons, polysilicides and refractory or high temperature metals such as tungsten. After the gate material has been established within the trench, a portion of the exposed gate material is masked, usually at an extremity of the chip, and the unmasked gate material is replanarized to expose the first protective layer and the temporary protective layer if the temporary layer has not been previously removed. Further, if the temporary protective layer has not been removed, it must now be removed. Then a second protective layer is grown over the gate electrode material and the first protective layer is then removed to expose the surface regions of the device. Thereafter, a device metallization layer is applied and patterned to provide external contacts connected to various device regions. Further, the metallization layer can be employed to interconnect the regions of a plurality of device cells disposed within a semiconductor substrate. A contact window can be opened through the second protective layer to make external contact with the gate electrode.

The process of the present invention can provide a MOS controlled thyristor by employing a partially processed semiconductor wafer comprising a first lightly doped zone of one conductivity semiconductor material atop a second heavily doped zone of opposite type conductivity semiconductor material and beneath a third moderately doped zone of opposite type conductivity semiconductor material.

An insulated gate transistor can be established by providing a partially processed semiconductor wafer comprising a first heavily doped zone of one type conductivity semiconductor material and a second zone of opposite type conductivity material atop the first zone of semiconductor material with the second zone being positioned adjacent the first semiconductor layer.

A field effect transistor can be fabricated by providing a partially processed semiconductor wafer comprising opposite type conductivity semiconductor material which preferably includes a moderately doped zone adjacent the first semiconductor layer and atop a heavily doped opposite type conductivity zone.

A vertical charge control field effect transistor can be fabricated by providing a partially processed semiconductor wafer having a moderately doped opposite type conductivity drift region atop a heavily doped opposite type conductivity contact region and establishing a trench through a substantial portion of the drift region.

The method of the present invention can also be used to fabricate other vertical semiconductor devices such as improved vertical junction and Schottky diodes as well as junction field effect transistors. In a preferred embodiment, this alternate preferred method omits the steps of forming the first region. The junction diode is formed when the partially processed wafer and the first semiconductor layer are of different conductivity types. In the Schottky diode embodiment, the partially processed wafer is of the same conductivity type as the first semiconductor layer and the metallization layer makes rectifying contact with the first semiconductor layer. A junction field effect transistor is formed by providing a partially processed wafer of the same conductivity type as the first semiconductor layer and including a lightly doped pinch-off zone in the first semiconductor layer or partially processed wafer.

BRIEF DESCRIPTION OF THE DRAWINGS

The features of the present invention which are believed to be novel are specified with particularity in the appended claims. The invention itself, however, both as to organization and method of operation together with additional objects, features and advantages of the improved method of fabricating a self aligned vertical channel insulated gate semiconductor device can be best understood by reference to the following detailed description when taken in conjunction with the accompanying drawings in which:

FIG. 2 is a three-dimensional illustration comparing two different devices fabricated in accordance with the present invention in which, in a first preferred embodiment, the major axis of the trench is oriented parallel to the major axis of the first layer and, in a second preferred embodiment, the major axis of the trench is oriented transverse to the major axis of the first layer;

DETAILED DESCRIPTION OF THE PREFERRED EMBODIMENTS

Figure 1A:
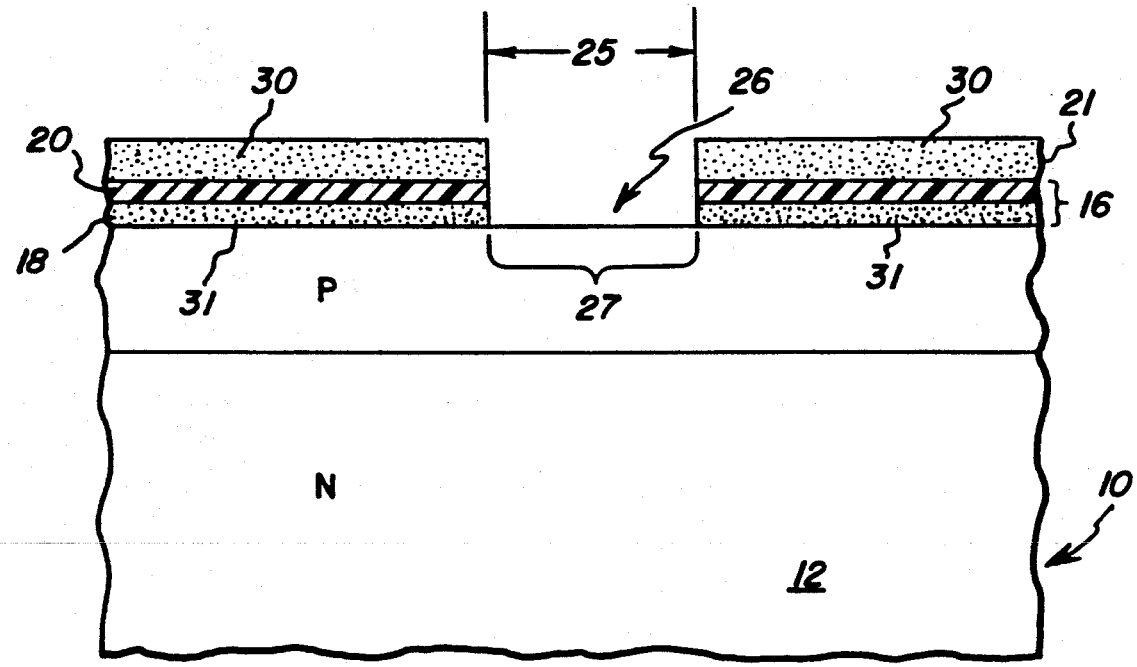
FIGS. 1A-1G are cross-sectional illustrations of a semiconductor device during successive stages of processing in accordance with the method of the present invention.

A self aligned method of fabricating a insulated gate semiconductor structure in accordance with the present invention is applicable to a broad range of semiconductor devices and can be used in combination with a variety of different semiconductor materials. The ensuing description discloses several preferred embodiments of the method of semiconductor device fabrication of the present invention a implemented in a silicon substrate because silicon devices or devices fabricated in silicon substrates make up the overwhelming majority of the currently available semiconductor devices. Consequently, the most commonly encountered applications of the present invention will involve silicon substrate devices. Nevertheless, it is intended that the invention disclosed herein can be also advantageously practiced in germanium, gallium arsenide or other semiconductor materials. Accordingly, application of the present invention is not intended to be limited to devices fabricated in silicon substrates, but instead will encompass those devices fabricated in any of a number of semiconductor materials.

Moreover, while the present description discusses a number of preferred methods of the present invention directed to silicon substrates, it is intended that these disclosures be considered as illustrative examples of the preferred embodiments of the present invention and not as a limitation on the scope and applicability of the present invention. Further, while the illustrated preferred embodiments of the present invention are discussed in connection with vertical channel insulated gate structures such as metal oxide semiconductor field effect transistors, metal oxide semiconductor controlled thyristors, insulated gate transistors, junction diodes, junction field effect transistors and Schottky diodes, it is not intended that the method of the present invention be limited to these devices, but rather these devices are included as illustrative examples to demonstrate the applicability of the method of the present invention to preferred commercial embodiments. Further, while a preferred method of the present invention provides for fabrication of devices exhibiting improved conductivity and improved current density, it is recognized that the fabricated devices will also exhibit the attendant benefits of reduced cell size and reduced cell repeat distance.

Given the corresponding relationships of FIGS. 1-9, corresponding parts have been designated with the same reference numeral as an aid to understanding the description of the present invention. Various parts of the semiconductor elements, however, have not been drawn to scale. Certain dimensions have been exaggerated in relation to other dimensions in order to present a clearer illustration and understanding of the invention. Although for the purposes of illustration the preferred embodiment of the method of fabricating a vertical channel insulated gate structure of the present invention are shown in each particular embodiment to include specific P and N type regions, it is understood by those skilled in the art that the teachings herein are equally applicable to vertical channel devices in which the conductivities of the various regions have been reversed to, for instance, provide the dual of the device. Further, although the embodiments illustrated herein show only a portion of a single cell of a particular device, it is understood that these regions are illustrations of only a portion of a device comprised of a plurality of cells arranged in a three dimensional structure.

Referring now FIG. 1, a preferred embodiment of the method of fabricating a self aligned insulated gate semiconductor device 10 in accordance with the present invention is illustrated during successive steps in the fabrication of a metal oxide semiconductor field effect transistor or MOSFET. In FIG. 1A, a partially processed semiconductor wafer 12 is provided. As will be discussed in more detail below in connection with FIGS. 3-7, the wafer 12 can comprise a plurality of layers of different types and conductivity semiconductor material, depending upon the ultimate device which is to be fabricated in accordance with the method of the present invention. In the illustrated MOSFET embodiment, the wafer 12 can comprise silicon and have a thickness of 20 microns and a resistivity of 5 ohms/cm. A first layer 14 is provided atop the partially processed semiconductor wafer 12. In the illustrated embodiment, the first layer 14 is of one type conductivity semiconductor material, while wafer 12 is doped to a carrier concentration of $10^{15}$ carriers per cc with opposite type conductivity impurity and which is illustrated to be N type conductivity material. It is to be recognized that in alternate preferred embodiments, examples of which are illustrated in FIGS. 8 and 9, the first layer can also be of opposite type conductivity. The first layer 14 can be established by, for instance, growing an epitaxial layer atop the partially processed semiconductor wafer 12. Alternatively, the first layer 14 can be established within the partially processed semiconductor wafer 12 by employing conventional implantation or diffusion techniques. In a particularly preferred embodiment, a thin oxide layer 18 having a thickness of approximately 200 angstroms is provided atop the partially processed wafer 12. Subsequently, one type conductivity carriers are implanted through the oxide and are driven to an appropriate depth to form the first layer 14. In a preferred embodiment, the first layer 14 can exhibit a carrier concentration of $10^{15}$ carriers per cc of one type conductivity, which are illustrated to be P type, and extend to a depth of approximately 1 micron. In a particularly preferred embodiment (not shown) the first layer 14 can comprise a first zone of moderately doped one type conductivity semiconductor material and a second heavily doped zone of one type conductivity material atop the first zone, with the moderately doped zone being adjacent the partially processed wafer 12, and the heavily doped zone forming a portion of a surface of the device 10 to, for instance, facilitate the establishment of an ohmic electric contact between the first layer 14 and an external electrode. The heavily doped surface zone can alternatively be implanted through the 200 angstrom oxide layer 18.

A first protective layer 16 is provided atop the first layer 14. In a preferred embodiment, the protective layer 16 can comprise the first oxide layer 18 and a first nitride layer 20. The nitride layer 20 can be established by, for instance, a chemical vapor deposition of a nitride layer atop the previously established oxide layer 18. The nitride over oxide first protective layer 16 can protect the surface of the wafer from further oxidation. In addition, the outer nitride layer protects the surface from etches which are specifically directed at oxide or silicon materials. The dual first protective layer 16 also facilitates the later establishment of automatic contact windows, discussed below. The initial oxide layer 18 can be thermally grown or deposited by chemical vapor deposition techniques. The initial oxide layer 18 also functions as an interface layer which helps the nitride layer adhere to the surface of the partially processed wafer. In a particularly preferred embodiment, the first protective layer can comprise a first oxide layer 18 having a thickness of 200 angstroms with a first nitride layer 20 having a thickness approximately in the range of 2000-5000 angstroms disposed thereon.

Thereafter a temporary protective layer such as a thick oxide layer 21 can be deposited on top of the first protective layer by, for instance, chemical vapor deposition. In a preferred embodiment, the temporary protective layer 21 is substantially thicker than the first protective layer 16 and can, for instance, have a thickness in the range of 3000-10,000 angstroms. The temporary protective layer 21 protects the unexposed surface of the device from being damaged during a subsequently-performed trench etch. More particularly, because the thickness of the temporary protective oxide layer 21 is substantially greater than the thickness of the oxide portion 18 of the first protective layer 16, the oxide portion 18 of the first protective layer 16 can be removed without removing all of the temporary protective layer 21.

A first window 25 is opened through a first portion of the temporary protective layer 21 and the first protective layer 16 has been removed by employing a first mask in combination with photolithographic techniques to expose a first portion 27 of the first layer 14. A second or unremoved portion 30 of the temporary protective layer 21 and protective layer 16 covers second portion 31 of the first layer 14. Photolithographic techniques used in combination with imaging materials such as an external mask, can be used to photolithographically pattern on the upper surface of the temporary protective layer 21 and to define the first portion of the temporary protective layer 21 and first protective layer 16 through which the first window 25 will be opened. The window 25 can be opened by initially removing the exposed portion of the temporary protective layer 21 with an oxide specific etch such as buffered hydrofluoric acid and subsequently, for instance, using a reactive ion etch to remove the first protective layer 16.

Figure 1B:
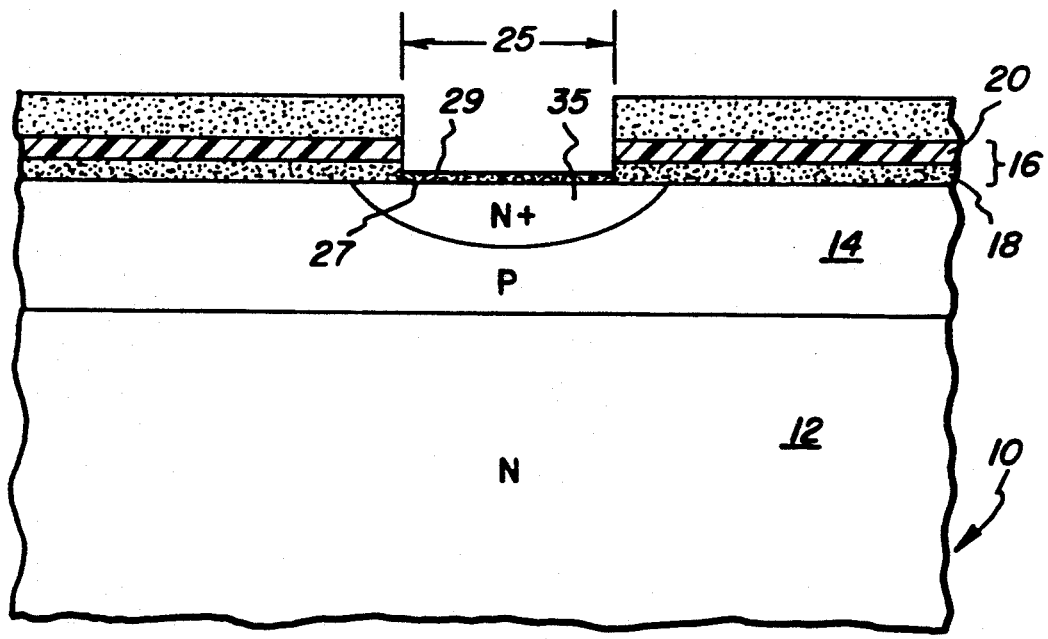

Referring now to FIG. 1B, once the first window 25 has been opened and a first portion 27 of the first layer 14 has been exposed, a first doping can be made into the first layer 14 through the first window 25 to form a first region 35. In a preferred embodiment, a slow diffusing heavy concentration of opposite type conductivity material, such as a phosphorous impurity, can be used in combination with conventional implantation or diffusion techniques to establish a first heavily doped opposite type conductivity region 35, shown as an N type conductivity region. In a preferred embodiment, the doping is performed by diffusion or implantation and a subsequent drive in a non-oxidizing inert ambient atmosphere such as a nitrogen ($N_2$) atmosphere containing one percent or less oxygen ($O_2$) During the drive, a second oxide layer 29 having a thickness of less than 500 angstroms and preferably less than 250 angstroms is grown in the first window 25 and over temporary protective layer 21. The thin oxide layer 29 formed during the drive should be removed prior to trench formation. It is preferred that the thin oxide layer 29 be removed by performing a dip etch using hydrofluoric acid. Again, it is noted that the temporary protective layer 21 is sufficiently thick to protect the first protective layer 16 during the dip etch.

Figure 1C:
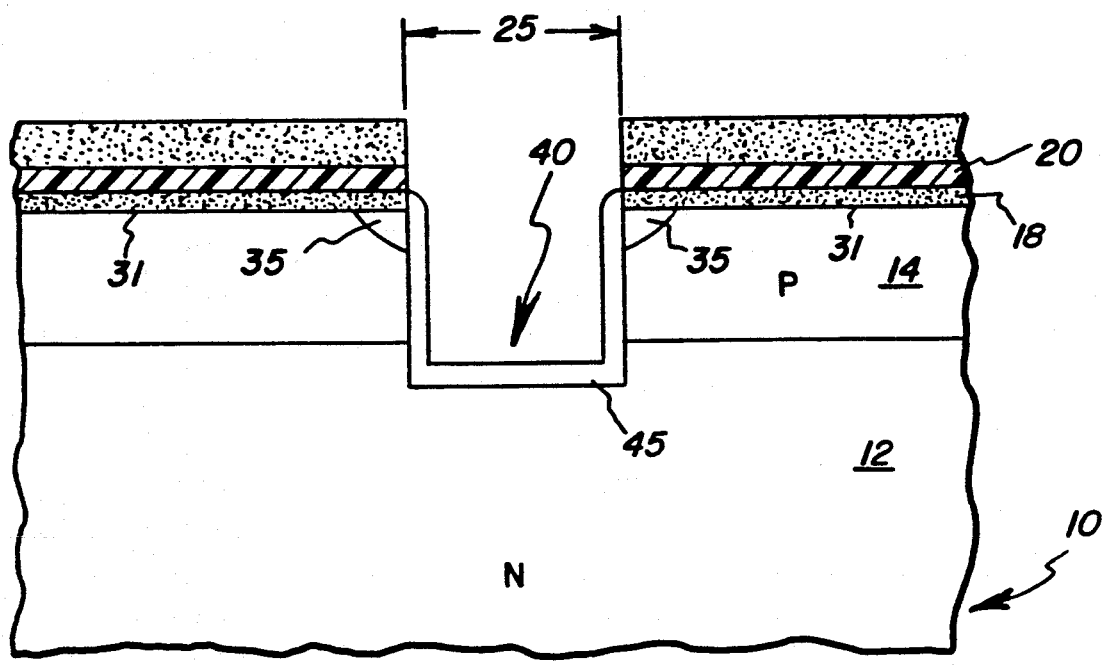

Subsequently, and referring now to FIG. 1C, a trench 40 is established through the first window 25, the temporary protective layer 21, the first region 35, and the first layer 14, and extends into the partially processed semiconductor wafer 12. It is preferred that the trench 40 be established with a directional etch which can, for instance, be a wet type directional etch, such as KOH, for use in the <110> direction in silicon. Alternatively, a directional dry etch such as a reactive ion etch can be employed with semiconductor materials of any orientation. The trench 40 can be narrow, of width less than 4 microns and preferably in the range of 0.5-2.5 microns.

It is preferred that, once the trench etch is complete, the temporary protective layer 21 be removed by, for instance, employing an oxide-specific etch such as a dip etch in buffered hydrofluoric acid. Once the temporary protective layer 21 has been removed, the nitride layer 20 portion of the first protective layer 16 is exposed. The temporary protective layer 21 however, can be allowed to remain until just after a gate replanarization is performed.

Subsequently, an insulation layer 45 is established on the interior sidewalls of the semiconductor trench 40. More particularly, the insulation layer 45 is formed on an exposed portion of the first region 35, an exposed portion of the first layer 14 and an exposed portion of the partially processed wafer 12. In a preferred embodiment, the insulation layer 45 can be established by, for instance, exposing the trench 40 at a high temperature to an atmosphere of oxygen to establish an oxide insulation layer 45 on the interior surface thereof. In the example of a silicon partially-processed wafer, the insulation layer can comprise silicon dioxide and have a thickness of less than 1000 angstroms and preferably approximately 500 angstroms. The insulation layer does not grow atop the second portion 31 of the first layer 14 because this is covered with a nitride layer 20 which prevents oxidation.

Figure 1D:
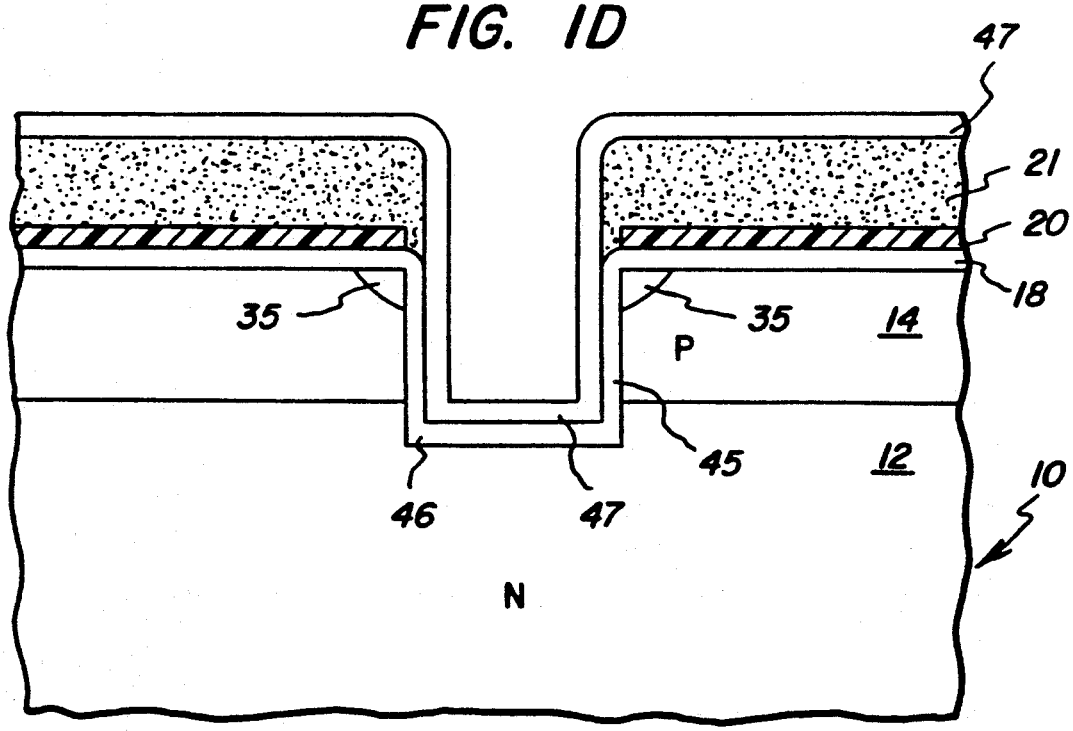
Figure 1E:
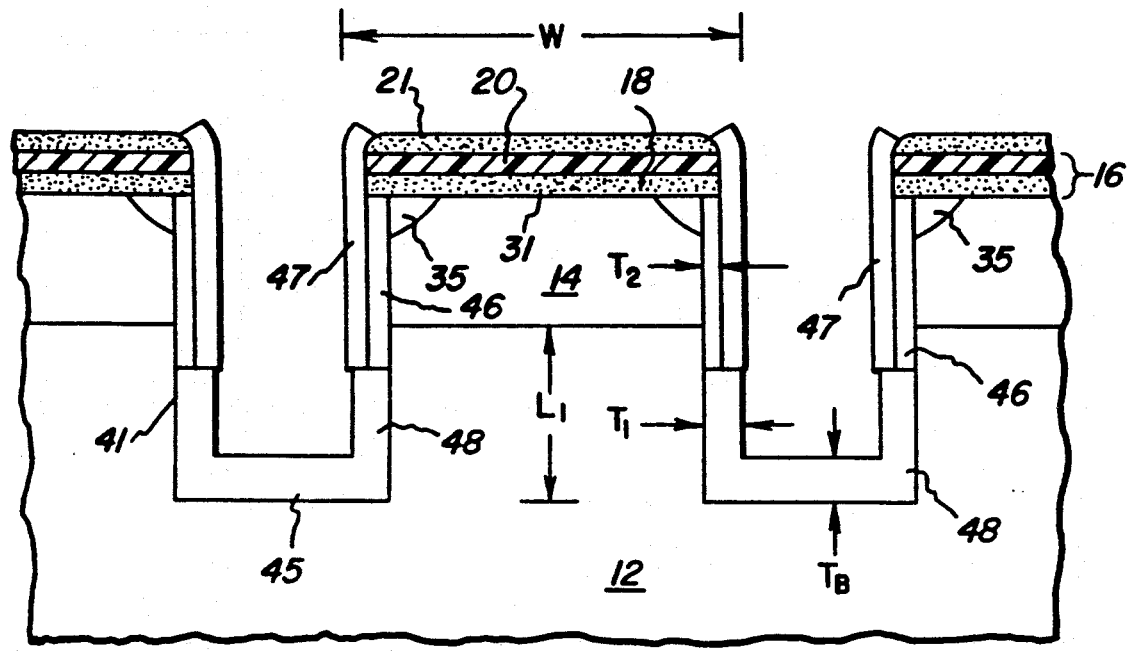

Referring now to FIGS. 1D and 1E, an alternative preferred embodiment of the present invention is illustrated wherein the trench 40 is formed in two or more successive etching steps and the insulation layer 45, as shown in FIG. 1E, comprises a thin oxide layer 46 disposed adjacent the first region 35, the first layer 14 and a first portion of the partially processed wafer 12. A thicker portion 48 of insulation layer 45 is provided adjacent the second portion of the partially processed wafer 12.

Initially, the trench 40 and the insulation layer 45 are established as discussed above in connection with FIG. 1C. The wafer remains coated with the temporary protective layer 21. Thereafter, a second nitride layer 47 can be established atop the temporary layer 21 and the insulation layer 45, as shown in FIG. 1D. It is preferred that the second nitride layer 47 have a thickness which is substantially less than the thickness of the first nitride layer 20 to allow the side nitride 47 to be removed, as discussed below, without removing the first nitride layer 20. In a preferred embodiment, the nitride coating 47 has a thickness in the range of 500-1000 angstroms. The nitride 47 deposited on the upper surface of the device and the bottom surface of the trench 40, as shown in FIG. 1D, can be removed by, for instance, employing a reactive ion etch to leave a nitride coating 47 atop the thin oxide layer 45 on the sidewalls of the trench 40. Subsequently, a light etch can be performed on the bottom of the trench 40, in the embodiment of FIG. 1D, to prepare the trench for further trench etching. The light etch can also remove from the bottom of the trench any oxide which may have been formed during the oxide or nitride depositions. Alternatively, if for instance, a reactive ion etch is to be employed to form the trench 40, the bottom oxide layer 46 can be allowed to remain at the bottom of the trench, inasmuch as the reactive ion etch will also eat through the oxide.

Thereafter, as shown in FIG. 1E, the trench 40 can be extended by etching a trench extension 41 which in this example, extends the trench 40 far into the partially processed wafer 12 to a depth $L_t$ measured from the surface of the partially processed wafer 12. The width W of each cell is defined by the separation between adjacent trenches 40 and, in particularly preferred embodiments discussed in more detail in the above referenced copending application, it is preferred that the ratio of $L_t/W$ be greater than or equal to 0.5. Now that the trench etch has been completed, the temporary protective layer 21 can be removed to expose the first protective layer 16.

The nitride coating 47 which covers the sidewalls of the trench 40 forms a sidewall spacer over the thin oxide layer 46 to prevent further oxide growth atop this layer. A second insulation layer 48 such as thermal oxide, which in the present silicon device embodiment can be silicon dioxide, is grown on the exposed surface of the trench extension 41. The second insulation layer 48 is grown only on the wall and bottom portions of the trench extension 41. In the preferred vertical charge control embodiment discussed in the above referenced copending application, the second insulation layer 48 is disposed adjacent the partially processed wafer 12 and can have a thickness $T_1$ on the sidewalls of the trench extension 41 and a thickness $T_B$ on the bottom surface of the trench extension 41. It is preferred that the second insulation layer 48 have a thickness in the order of 1,500–10,000 angstroms on the sidewalls of the trench extension 41 and a thickness of approximately 1,500–10,000 angstroms on the bottom of the trench extension 41. It is preferred that the bottom thickness $T_B$ be greater than $T_1$ to make the resulting device less corner breakdown limited. A thicker oxide can be formed on the bottom of the trench by damaging the trench bottom prior to oxidation.

As illustrated, the first insulation layer 46 adjacent first layer 14 of the device 10 has a thickness $T_2$ which is less than $T_1$. It is preferred that the thickness $T_2$ of the first insulation layer 46 be approximately in the range of 100–1,500 angstroms.

It is to be recognized that the sidewall of the trench 40 can be coated with an insulation layer 45 comprising several zones of different thicknesses by etching the trench 40 in several successive steps and coating each of the newly exposed trench sidewalls first with an oxide layer of ever increasing thickness as trench depth increase, and then capping the deposited oxide with a nitride spacer. This multiple zone oxide layer technique can be used to achieve an insulation layer 45 in which the transition from a thin oxide to a thicker oxide is made as a non-abrupt transition and preferably as a smooth transition.

After the second insulation layer 48 has been deposited, the nitride layer 47 is removed to expose the insulation 45 on the sidewall of the trench 40. In some embodiments, the trench nitride 47 can remain without adversely effecting the performance of the final device.

Figure 1F:
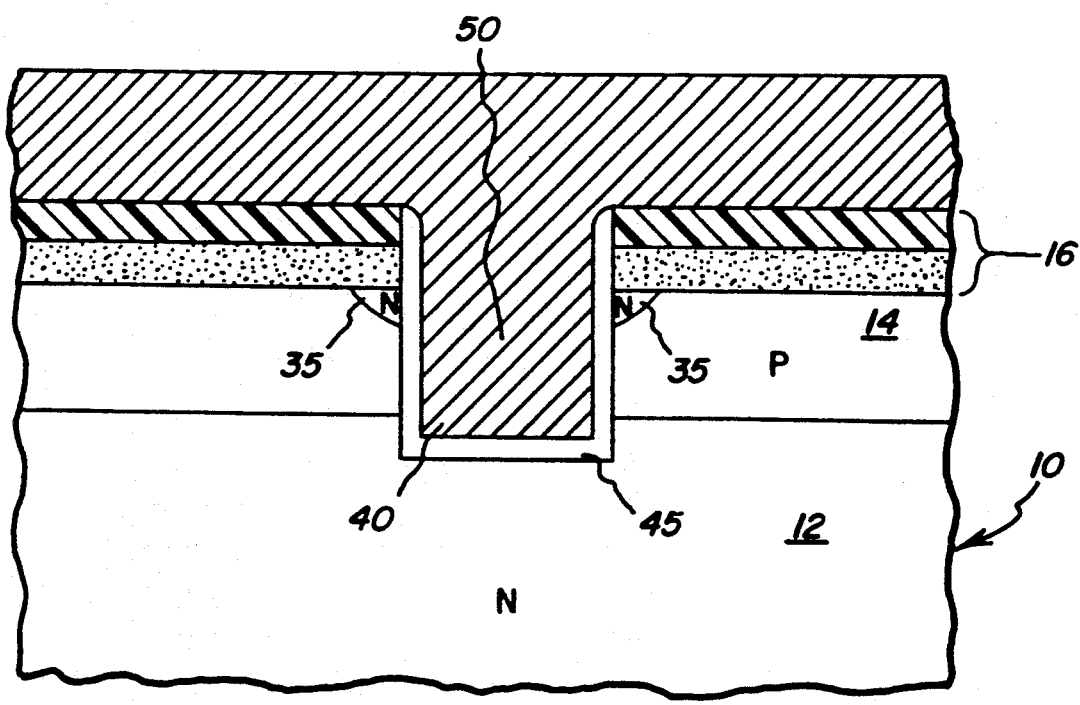

As shown in FIG. 1F, the trench 40 is next filled with a gate material to form a gate electrode 50. It is preferred that the gate material be both oxidizable and replanarizable. The gate material can be a doped polysilicon, a polysilicide or a high temperature refractory metal such as tungsten. In a preferred embodiment, the trench 40 can be partially filled with a gate material 50 such as polysilicon. The deposited polysilicon is then doped with a heavy concentration of carriers of either conductivity type to render the deposited gate material conductive. Subsequently, the trench 40 is completely filled with the gate material. Thereafter, the gate material, both doped and undoped, is subjected to a drive to diffuse the carriers and render the deposited gate electrode material 50 fully conductive. The gate dopant drive can, in an alternate embodiment, be accomplished during subsequent processing steps.

In an alternative embodiment, the trench 40 is completely filled with gate material 50 which is subsequently doped with either conductivity type carriers. This process is less preferable inasmuch as diffusion in polysilicon is limited.

As shown in FIG. 1F, while the trench 40 is being refilled with gate material 50, the first protective layer 16 disposed on the upper surface of the semiconductor device is also coated with a gate material 50. It is desirable to make external contact to the gate material, as shown in FIG. 1H, by maintaining a strip 60 of gate material on the upper surface of the wafer extending transverse to the lateral direction of the trenches. The strip of gate material allows the gate to be interconnected and also provides a contact zone which can be used to make external electrical contact to the gate material. Thus, the gate material deposited on the surface of the device can be patterned by, for instance, employing photolithographic techniques to mask a portion of the gate material 50 deposited on the surface and thereby define the gate contact strip 60. The gate material 50 comprising the gate contact strip 60 shown in FIG. 1H thus resides atop the first protective layer 16, as shown in FIG. 1F, and also atop the temporary protective layer 21 if it is present.

Figure 1G:
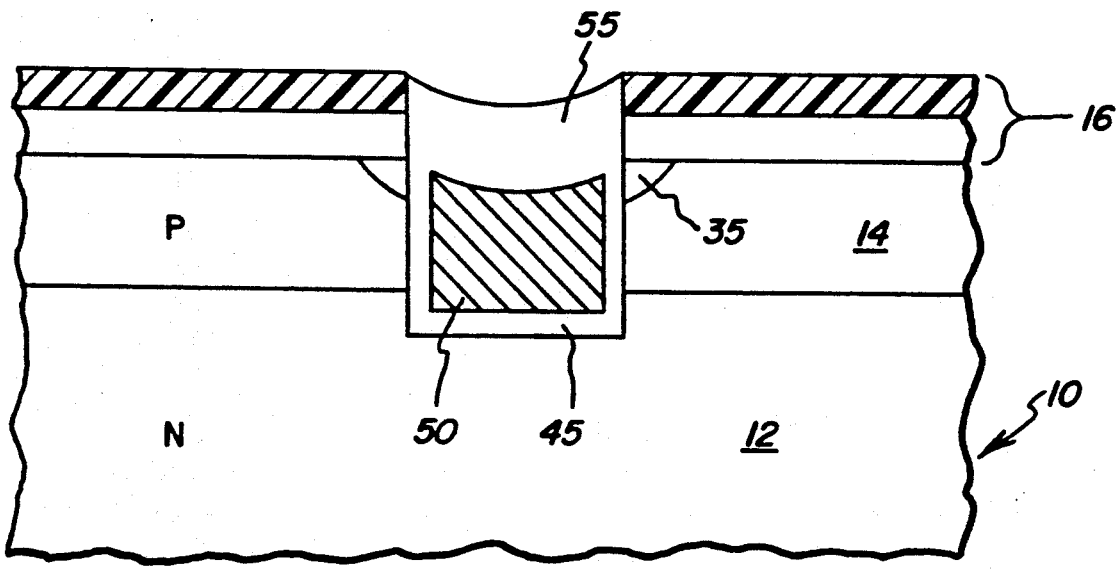
Figure 1H:
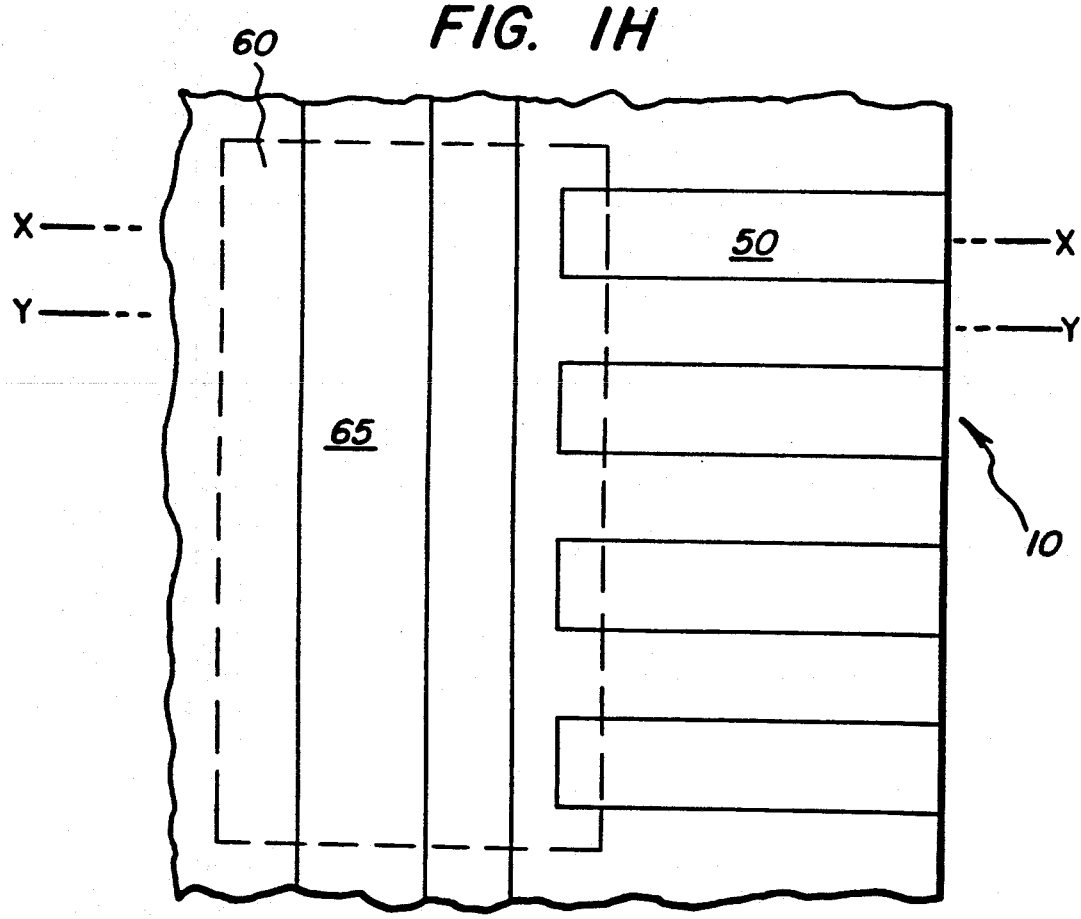
FIG. 1H is a top plan view of a device during final stage of processing in accordance with the present invention.

As shown in FIG. 1G, the excess gate material 50 is removed from the upper surface of the device 10 to re-expose the first protective layer 16 to facilitate further processing of selected device regions. More particularly, an etch, such as a reactive ion etch or a wet type etch, is used to controllably remove the unmasked portion of the gate material 50 previously deposited on the upper surface of the semiconductor device. The etch is continued until the first protective layer 16 is re-exposed. This process of removing the excess gate material is referred to as replanarization. It is noted that if the temporary layer oxide 21 has not been previously removed, this layer can be removed at this time by an appropriate etch.

During the replanarization process, the gate electrode material 50 residing within the trench 40 is also etched. Generally the etch is continued until the gate material 50 within the trench 40 is recessed below the surface of the first protective layer 16 to ensure that all excess gate material 50 is removed from the surface of the device. The gate material 50 is thus recessed below the upper surface of the semiconductor device 10.

In order to facilitate further processing of the contact strip 60 of the semiconductor device 10, shown in FIG. 1H, the masking material atop the contact strip 60 can be removed.

Subsequently, and as shown in FIG. 1G, a second protective layer 55 is provided on top of the exposed gate material 50. In a preferred embodiment, the second protective layer 55 comprises insulation such as a thermally grown oxide layer which can, for instance, be a silicon dioxide layer grown atop the oxidizable gate material 50 within the trench 40 and also on the contact strip 60 (see FIG. 1I). The second protective layer 55 does not grow atop the first protective layer 16 inasmuch as the nitride layer 20 blocks growth in this area. This second protective layer 55 can be established by presenting the exposed portion of the gate material 50 in a high temperature atmosphere of oxygen to form the oxide coating thereon. It is important that the thickness of the gate oxide layer 55 be thicker than the thickness of the oxide portion 18 of the first protective layer 16 to facilitate the establishment of automatic contact windows as is discussed below. As previously discussed, the thickness of the first oxide layer 18 is in the order of 200 angstroms. Thus, the thickness of the gate oxide 55 is substantially more than 200 angstroms and preferably in the order of 1000 angstroms.

Figure 1I:
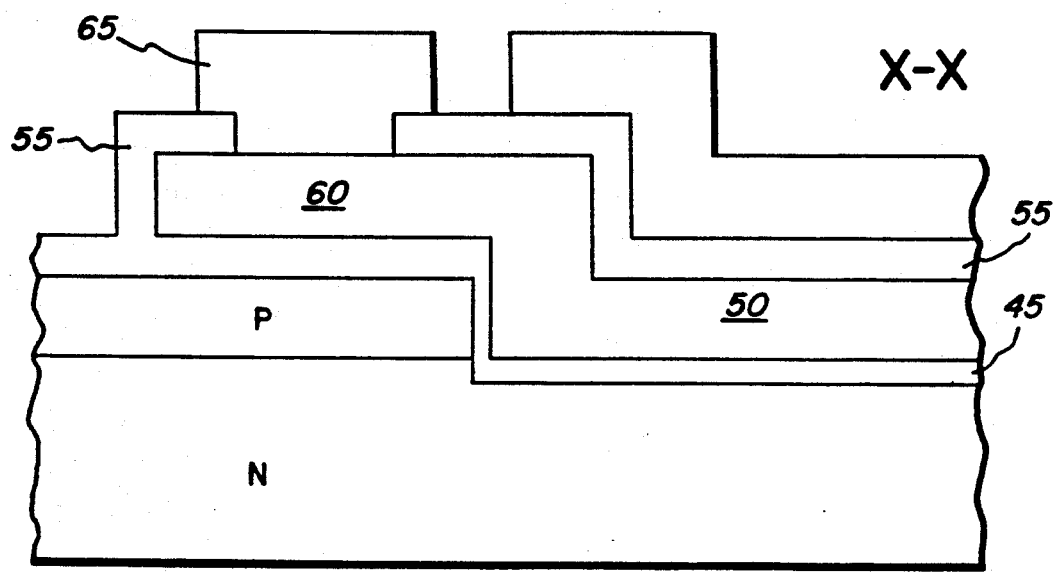
FIG. 1I is a side view of the upper surface of the device of FIG. 1H taken along the lines X—X.
Figure 1J:
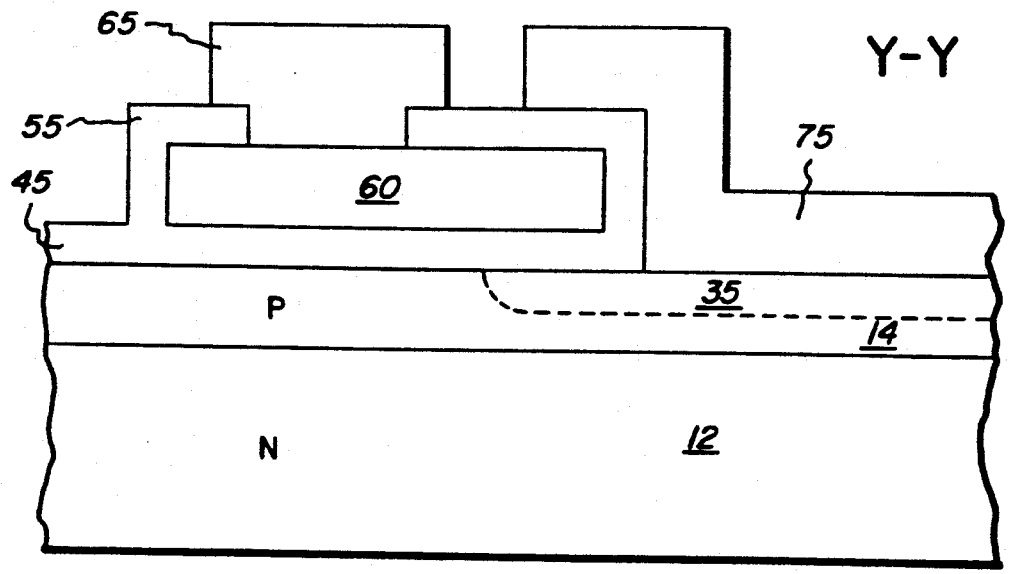
FIG. 1J is a side view of the upper surface of the device of FIG. 1H taken along lines Y—Y.

An external connection to the gate electrode 50 can next be made. As shown in FIGS. 1I and 1J, a contact window 62 is opened through the second protective layer 55 to expose a portion of the gate contact strip 60. The connector contact window 62 is preferably oriented transverse to the longitudinal direction of the gate fingers 50 and substantially in line with the length of the contact strip 60 which can be, for instance, substantially perpendicular to the longitudinal direction of the gate fingers. It is to be recalled that in the present example the surface of the device is coated with a first protective layer 16 comprising nitride layer 20 over an oxide layer 18 while the gate contact strip 60 is coated with only an oxide layer 55. Thus, a photolithographic technique can be used to pattern the contact window 62 and an oxide specific etch, such as buffered hydrofluoric acid which etches silicon oxide but does not etch silicon nitride, can be used to open the gate contact window 62 and expose the contact strip 60.

A metallization layer 65 is then deposited within the contact window 62 and makes electrical contact to the gate contact strip 60 to provide an electrical contact to the gate fingers 50 and to interconnect the gate fingers and provide external contact to the gate of the device. The deposited gate metal 65 can be patterned using photolithographic techniques and the excess gate metal is removed. The photoresist previously deposited to define the gate electrode contact window can also be removed to expose the first and second protective layers 16 and 55, respectively.

As shown in FIG. 1H, 1I and 1J, the next step is to provide source metallization is also provided. A source window 70 is opened through the first protective layer 16 (not removed) which, in the illustrated example, comprises a nitride layer 20 over an oxide layer 18 and which covers the surface of the device 10 except in the area of gate 50 and gate contact strip 60. The source contact 70 window can be defined by photolithographic techniques to cover a substantial portion of the device surface excluding the gate contact strip 60. The source window 70 can encompass a portion of the longitudinally extending gate fingers 50 which are covered by second protective layer 55. The source window can be opened through the first protective layer 16 without exposing the gate material 50 because the second protective layer 55 is substantially thicker than the oxide layer 18 of the first protective layer 16. If the temporary protective layer 21 has not been previously removed, it can also be removed at this time by, for instance, a buffered hydrofluoric acid etch. If the temporary layer 21 remains, the second protective layer 55 must be thicker than the temporary layer 21. If the temporary layer is to be allowed to remain until the final processing steps, the temporary layer 21 should have a thickness of approximately 3000 angstroms and the second protective layer 55 should have a thickness of approximately 5000 angstroms.

The exposed nitride layer 20 of the first protective layer 16 can be removed by using a nitride specific etch such as a reactive ion etch which etches silicon nitride but does not etch silicon oxide. Then a silicon oxide etch such as buffered hydrofluoric acid, or alternatively, a reactive ion etch, is used to remove the underlying oxide layer 18. Thereafter, a source metal layer 75 such as aluminum is deposited on the surface of the device 10 to make contact with exposed portions of the device 10 which, as shown in FIG. 1J, include the first semiconductor layer 14 and the first heavily doped, opposite type conductivity region 35. The source metal 75, in addition to making contact with these regions, can short the junction between the first region 35 and the first layer 14 to inhibit this junction from becoming forward biased to thereby allow the device to function under insulated gate control. The source metal 75 can be photolithographically patterned and the excess source metal removed. In particular, the source metal 75 must not contact the gate metal 65.

While FIG. 1 and FIGS. 3-6 are directed to enhancement mode devices wherein an insulated gate, in response to an appropriate applied bias, establishes a conductive channel between the first region 35 and the partially processed wafer 12, the described method of the present invention can also be used with minor additions to establish a depletion mode insulated gate device in which the insulated gate electrode is used to repress an existing channel. For instance, as shown in FIG. 1C, after the trench 40 has been etched and before the insulation layer 45 is formed, an opposite type conductivity diffusion can be performed to establish an opposite type conductivity channel (not shown) between the region 35 and the partially processed wafer 12 to, for instance, establish a depletion mode MOSFET device.

The method of the present invention employs the same first window 25 through the first protective layer 16 to establish both the first region 35 and the trench 40. Accordingly, the trench is precisely aligned with the first region 35 without regard to the size of the first region 35 or the trench 40. Therefore, the first region 35 can be fabricated with minimum dimensions adequate to achieve the desired operating characteristic and without regard to providing extra material as a tolerance for misalignment.

The operation of a typical MOSFET embodiment of the device fabricated by the present invention will now be described in connection with FIG. 1G. The gate 50 in combination with the insulating layer 45 establishes an insulated gate structure which extends over the portion of the first layer 14 exposed by the trench 40. In response to an appropriate bias potential applied to the gate 50, a channel is established for conductively coupling opposite type conductivity or N type carriers from the partially processed wafer 12 through the first layer 14 to the opposite type source region 35. In response to removal of that bias, the channel is repressed and conduction ceases. As will be discussed in more detail in connection with FIG. 6 below, in those devices which are required to withstand or block a high reverse voltage, the trench 40 can be extended substantially into the partially processed wafer 12 to establish a vertical charge control region extending substantially through the drift region portion of the partially processed wafer 12. In other devices, the trench 40 can be extended deeply into the partially processed wafer 12 to reduce the on-resistance or increase the peak controllable voltage or alternatively reduce the length of the drift region and thickness of the device. Further details of the operation of the vertical charge control insulated gate semiconductor device also can be found, in the above-referenced copending application Ser. No. 638,692 filed Dec. 5, 1986.

The gate electrode 50 in response to an appropriate bias potential, and during reverse bias operating circumstances, couples to the electric field established by the ionized impurities disposed within the partially processed semiconductor wafer 12 and reorients the electric field away from the the first layer 14 and more particularly parallel orients the field to the first layer 14 and toward the gate electrode 50. Reorienting these electric field lines and coupling to the charge carriers within the partially processed semiconductor wafer 12 to the gate electrode 50 allows the devices to sustain a greater breakdown voltage for a given concentration of charge carriers within the region 12. Accordingly, the doping concentration of the region 12 can be increased to increase the conductivity of the device.

Referring now to FIG. 2, the preferred method of fabricating a vertical channel insulated gate semiconductor device in accordance with the present invention, can be used to fabricate two different embodiments of devices in which the first region 35 is alternately disposed within the device. The first embodiment, shown in the righthand side of FIG. 2, is labeled "A" and shows the source region 35 having a major axis which is disposed approximately parallel to the major axis of the trench 40 and the gate electrode 50. The second embodiment, shown in the lefthand side of FIG. 2 and labeled "B", shows source region 35 with its major axis disposed transverse to the major axis of the trench 40 and the gate electrode 50.

Figure 3:
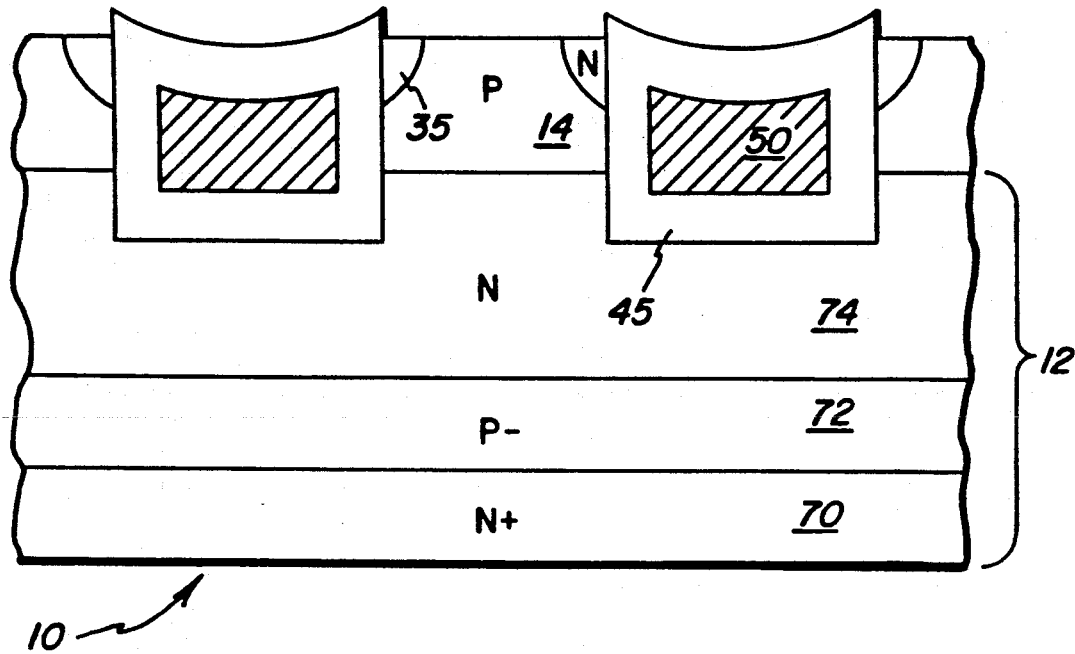
FIG. 3 is a cross-sectional illustration of a MOS controlled thyristor fabricated in accordance with the present invention.
Figure 4:
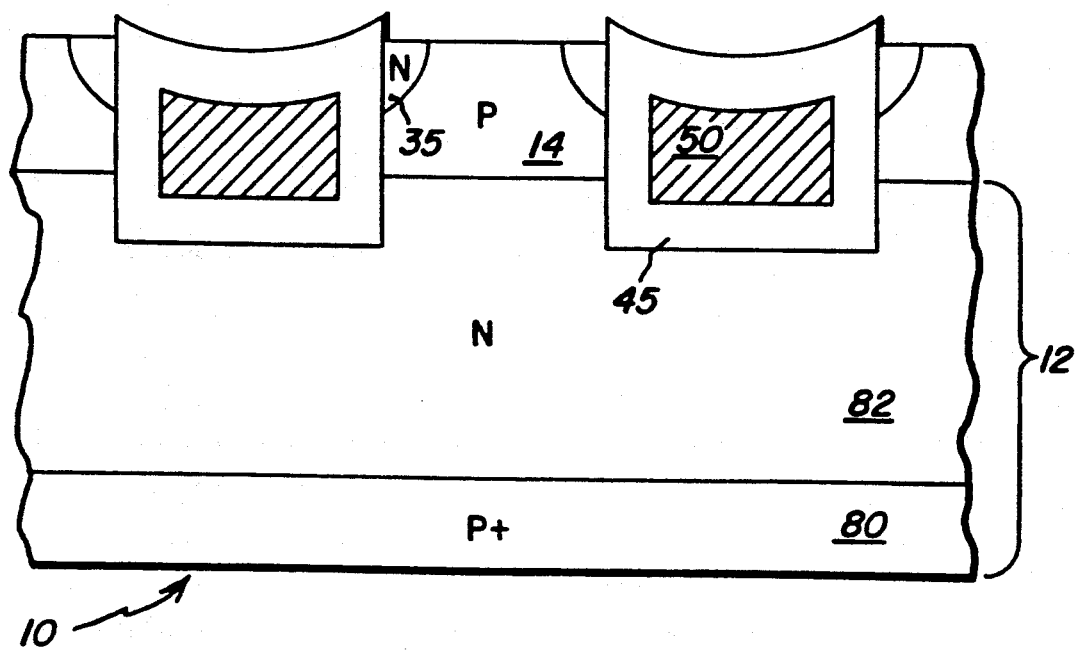
FIG. 4 is a cross-sectional illustration of an insulated gate transistor fabricated in accordance with the present invention.
Figure 5:
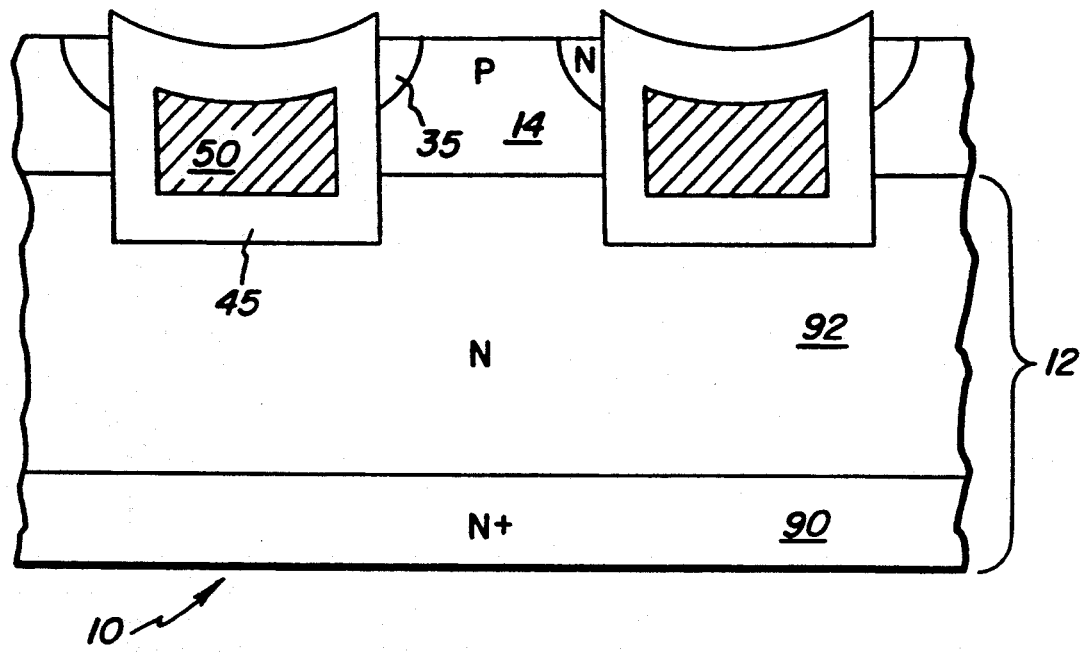
FIG. 5 is a cross-sectional illustration of a field effect transistor fabricated in accordance with the present invention.
Figure 6:
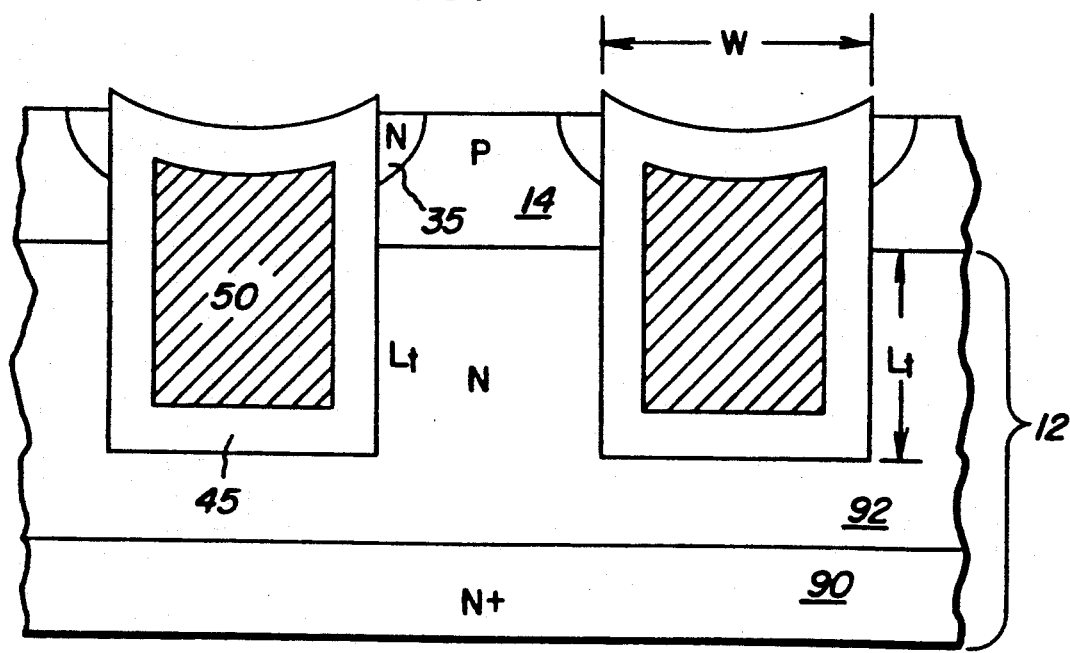
FIG. 6 is a cross-sectional illustration of a vertical charge controlled field effect transistor fabricated in accordance with the present invention.
Figure 7:
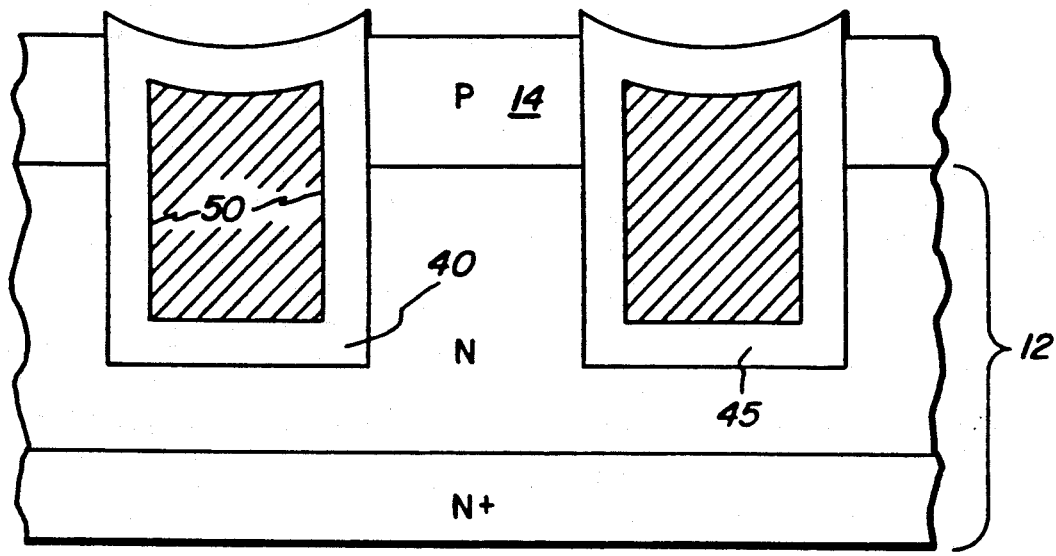
FIG. 7 is a cross-sectional illustration of a vertical charge control diode fabricated in accordance with the present invention.
Figure 8:
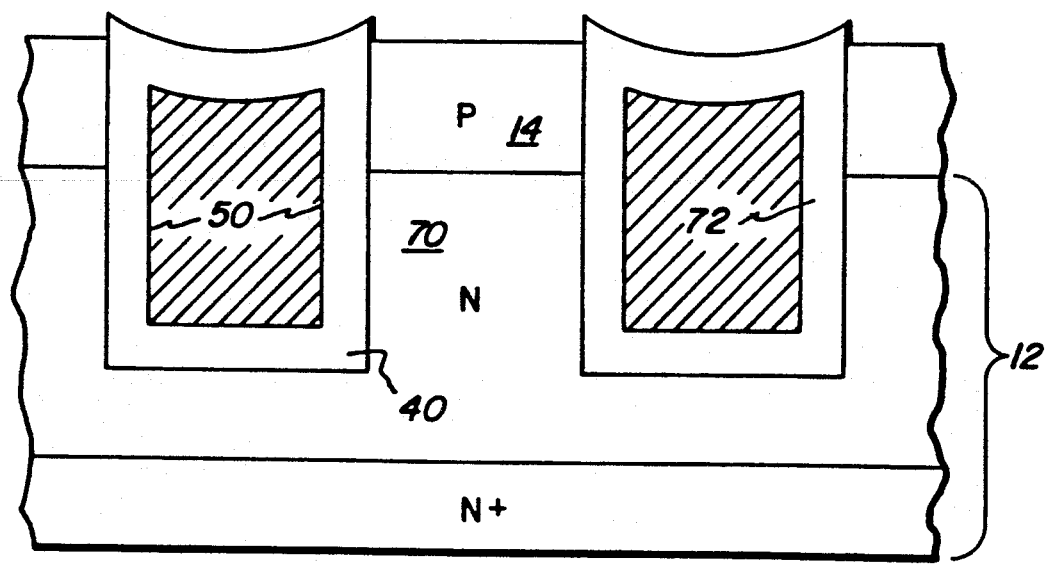
FIG. 8 is a cross-sectional illustration of a vertical charge control JFET fabricated in accordance with the present invention.
Figure 9:
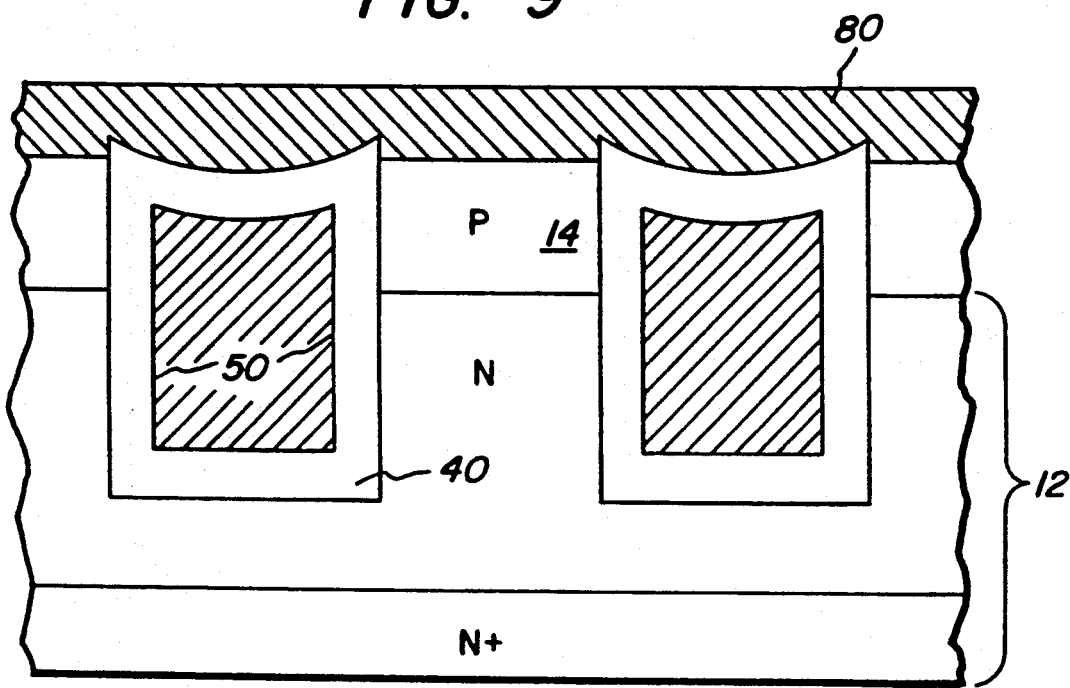
FIG. 9 is a cross-sectional illustration of a Schottky diode fabricated in accordance with the present invention.

Referring now to FIGS. 3–6, the method of fabricating a self aligned vertical channel semiconductor device in accordance with the present invention is shown as applied to a MOS controlled thyristor (MCT) in FIG. 3; to an insulated gate transistor (IGT) in FIG. 4; to a field effect transistor (FET) in FIG. 5; to a vertical charge control FET (VCCFET) in FIG. 6; to a junction diode in FIG. 7; to a junction field effect transistor in FIG. 8 and to a Schottky diode in FIG. 9.

In the MOS controlled thyristor of FIG. 3, the partially processed semiconductor wafer or substrate 12 is shown to comprise a first zone 71 with a second zone 72 of lightly doped one type conductivity material is disposed thereon. The first zone 71 is comprised of heavily doped opposite type conductivity material. A third zone of opposite type conductivity material, shown an N type base layer 74, is disposed atop the P— type second zone 72. This partially processed semiconductor wafer 12 can be formed by alternative methods. In a first method, the lightly doped P— zone 72 is the substrate and the first zone 71 of heavily doped opposite type conductivity can be established by either epitaxial growth or by doping techniques such as implantation or diffusion techniques. Similarly, the moderately doped N type third zone 74 can be disposed on the opposite surface of the lightly doped P— second zone 72 by either epitaxial growth or by doping techniques such as implantation or diffusion techniques. In an alternative embodiment, the heavily doped N+ first zone 71 can be the substrate and the lightly doped P— second zone can be established thereon by, for instance, epitaxial growth or doping. Subsequently, the third zone 74 can be established on the P— second zone 72 by either epitaxial growth or doping. Thereafter, the partially processed semiconductor wafer 12 is processed further in accordance with the processing steps previously discussed in connection with FIGS. 1A–1J to provide the MOS controlled thyristor 10 in accordance with the present invention.

Referring now to FIG. 4 and the insulated gate transistor illustrated therein, the partially processed semiconductor wafer 12 is shown to comprise a heavily doped P+ first zone 80 and a moderately doped N type second zone 82 atop the first zone. In a first preferred embodiment, the heavily doped P+ first zone 80 can be the substrate and the N type second layer 82 can be formed on the substrate by either epitaxial growth or doping techniques such as implantation or diffusion techniques. Alternately, the N type conductivity second zone 82 can be the substrate and the P first zone 80 can be formed thereon by either epitaxial growth or doping techniques such as implantation or diffusion techniques. Thereafter, the partially processed semiconductor wafer 12 comprising the first zone 80 and the second zone 82 can be processed in accordance with the process steps discussed above in connection with FIGS. 1A–1J to provide the insulated gate transistor 10.

Referring now to FIG. 5, a vertical channel field effect transistor 10 fabricated in accordance with a preferred embodiment of the method of the present invention is illustrated. The partially processed wafer 12 can comprise a heavily doped N+ first zone 90 having a moderately doped N type second zone 92 disposed thereon. Either the N+ first zone 90 or the N second zone 92 can be the substrate and the other zone can be established thereon by epitaxial growth or doping techniques such as implantation or diffusion techniques. Thereafter, the partially processed wafer 12 is processed in accordance with the steps of FIGS. 1A–1J to provide a field effect transistor.

Referring now to FIG. 6, a particularly preferred embodiment of the present invention can provide a vertical charge control field effect transistor wherein a preferred method of the present invention is employed to established vertical trenches 40 which extend substantially into the partially processed wafer 12. The partially processed wafer 12 can comprise a first heavily doped layer 90 and a second moderately doped layer 92 as disclosed above in connection with FIG. 5. More particularly, as shown in FIG. 6, the trench 40 extends a substantial distance $L_t$ into the second zone or drift layer 92 such that the insulation layer 45 and the gate electrode 50 extend proximate a substantial portion of the drift layer 92. Trench 40 preferably extends within the wafer 12 to define a pedestal having a length $L_t$ and a width W, wherein the ratio of $L_t$ to W is 0.5. The gate electrode 50 provides charge coupled control of the electric field established by the ionized carriers within the drift region 92 of the device during reverse bias conditions to permit the device to withstand greater voltages. A more complete discussion of the vertical charge control operation of the device under reverse bias conditions is provided in the above-referenced copending application for "Improved Semiconductor Devices Exhibiting Minimum On-Resistance" filed concurrently herewith as Ser. No. 938,692 filed Dec. 5, 1986.

Referring now to FIG. 7, a still further preferred embodiment of the self aligned method of fabricating a vertical channel semiconductor device in accordance with the present invention is shown wherein the method of the present invention is used to establish a vertical charge control diode. The method of the present invention previously disclosed in connection with FIGS. 1A–1H, is practiced with the exception of the step of establishing the source region 35 within the first window 25, which step is omitted.

After the first window 25 is opened through the first protective layer 16 by photolithographic techniques, the trench 40 is established through the first window 25, extending through the first layer 14 and for a substantial distance into the partially processed wafer 12. In a preferred embodiment, the trench 40 extends within the wafer 12 to define a region of the wafer 12 having a length $L_t$ and a width W, wherein the ratio of $L_t$ to W is greater than 0.5. The trench 40 is coated with an insulation layer 45 and a gate electrode material 50 is deposited within the trench 40.

FIG. 8 is an illustration of a vertical section taken through a vertical charge control junction field effect transistor (JFET) fabricated in accordance with the present invention. More particularly, a JFET can be formed by providing a first layer 14 of the same conductivity as the partially processed wafer 12. Thus, in essence, a channel 70 of the same type conductivity is formed between adjacent trenches 40 and the insulated gate 50, disposed within each trench 40, in response to an appropriate bias pinches off the channel 70 and inhibits conduction through the channel 70. A portion of layer 12 or 14 disposed between the trenches 40 can be lightly doped to facilitate turn-off. In response to removal of the bias, the channel is re-established. Gate 50 is separated from channel 70 by gate insulation 72. The aforedescribed JFET embodiment describes a depletion mode JFET in which the channel is depleted or pinched off. An enhancement mode JFET can also be established with the method of the present invention.

Referring now to FIG. 9, a cross-sectional illustration of a vertical Schottky diode is also shown wherein said partially processed semiconductor wafer 12 comprising the same type conductivity material as the first layer 14. A metal layer 80 is disposed in Schottky or non-ohmic contact with the first layer 14. Thus, a diode is formed between the first layer 14 and the metal layer 80.

It is to be recognized that while the preferred embodiments of the self aligned method of fabricating an insulated gate semiconductor device have been disclosed with respect to metal oxide semiconductor field effect transistors, insulated gate transistors, junction transistors, insulated gate thyristors and Schottky and junction diodes, it is recognized that the self aligned insulated gate techniques of the present invention can be employed to establish any number of semiconductor devices. Further, it is to be recognized that the method of self aligned fabrication of the present invention contributes significantly to the fabrication of improved semiconductor devices by providing for precisely aligned regions, which thus requires less tolerance for misalignment between regions. Hence the fabrication method of the present invention makes maximum use of available semiconductor chip area to improve cell density and reduce cell size and cell repeat distance.

While the preferred embodiments of the present invention have been illustrated and described, it is clear that the invention is not so limited. Numerous modifications and changes, variation and substitutions and equivalents will occur to those in the art without departing from the true spirit and scope of the present invention. Accordingly, it is intended that the invention herein be limited only by the scope of the appended claims.

What is claimed is:

1. A self-aligned method of fabricating a self aligned vertical channel semiconductor device comprising the steps of:
   (a) providing a partially processed semiconductor wafer which has been partially processed in accordance with the type of device being fabricated to include any layers which are necessary to enable process steps (b) through (s) below to provide the desired device;
   (b) providing a first oxide layer on said partially processed wafer;
   (c) doping said wafer through said oxide layer to establish a first layer of one type conductivity semiconductor material atop said semiconductor wafer;
   (d) providing a first nitride layer atop said first oxide layer;
   (e) opening a first window through said nitride layer and said first oxide layer to expose a first surface portion of said first layer;
   (f) doping said first surface portion of said first layer with opposite type conductivity dopant materials to establish a first region of opposite type conductivity extending into said first layer from said first surface portion of said first layer and beneath a portion of said first nitride and oxide layers;
   (g) establishing a trench having substantially vertical walls, having a width which is less than or equal to 3 microns and extending through said first window, said first region and said first layer and into said partially processed wafer to expose surfaces of said first region, said first layer and said partially processed wafer;
   (h) establishing a first, non-nitride insulation layer having a thickness $T_2$ in said trench on the exposed surfaces of said first region, said first layer and said partially processed wafer;
   (i) establishing a second nitride layer atop said first insulation layer;
   (j) etching said trench further into said wafer to depth $L_t$ to thereby expose a further portion of said wafer and define a pedestal having a width W such that the ratio $L_t$ to W is greater than or equal to 0.5;
   (k) growing a second insulation layer having a thickness $T_1$ within said trench adjacent said further portion of said partially processed wafer such that $T_1$ is greater than $T_2$;
   (l) removing said second nitride layer;
   (m) filling said trench with conductive gate material by depositing said conductive gate material into said trench and over said wafer;
   (n) forming a second protective layer atop a portion of said conductive gate material;
   (o) removing all said conductive gate material except said conductive gate material which is disposed either within said trench or beneath said protective layer;
   (p) opening a second window through said second protective layer to expose a portion of said conductive gate material;
   (q) forming a gate electrode in ohmic electrical contact with said conductive gate material;
   (r) opening a source contact window; and
   (s) depositing a source metal in electrical contact with said first layer and said first region.

2. The method of claim 1 wherein the step of forming a second protective layer atop said portion of said conductive gate material comprises establishing a second oxide layer atop said conductive gate material, said second oxide layer having a thickness greater than the thickness of said first oxide layer.

3. The self aligned method of claim 1 wherein the step of opening a second window through said second protective layer comprises the steps of:
   photolithographically patterning said second window on said second protective layer to expose a selected portion of said second protective layer; and
   etching said exposed portion of said second protective layer to expose said conductive gate material.

4. The method of claim 1 wherein the step of doping said first surface portion of said first layer to establish a first region comprises performing a dopant drive to drive said opposite type conductivity dopant materials into said first layer from said first surface portion of said first layer and, during said dopant drive, establishing a second oxide layer atop said first nitride layer, said second oxide layer enabling removal of the second nitride layer without removing the first nitride layer.

5. The method of claim 1 wherein the step of opening a source contact window comprises the steps of:

photolithographically patterning said second window on said first nitride layer to expose a portion of said first nitride layer;
etching the exposed portion of said first nitride layer to expose a portion of said first oxide layer;
etching the exposed portion of said first oxide layer without etching through said second protective layer to expose a portion of said first region and said first layer; and
establishing an electrical contact to said first region and said first layer.

6. The method of claim 1 wherein the step of establishing a second nitride layer within said trench comprises chemical vapor deposition of nitride material.

7. The method of claim 1 wherein the step of filling said trench with said conductive gate material comprises the steps of:
partially filling said trench with a semiconductor gate material;
doping said semiconductor gate material with a heavy concentration of dopant to render said semiconductor gate material conductive;
filling the remainder of said trench with said semiconductor gate material; and
exposing said semiconductor gate material to a high temperature to diffuse said dopant and render all of said semiconductor gate material within said trench conductive.

8. The method of claim 1 wherein the step of filling said trench with gate material comprises planarizing said gate material.

9. The method of claim 1 wherein:
said second insulation layer comprises an oxide layer; and
the step of rowing a second insulation layer within said trench additionally comprises the step of damaging the bottom of said trench to promote the growth of oxide on the bottom of said trench.

* * * * *